United States Patent [19]

Norris et al.

[11] Patent Number: 4,787,696
[45] Date of Patent: Nov. 29, 1988

[54] MOUNTING APPARATUS FOR OPTICAL FIBERS AND LASERS

[75] Inventors: Peter E. Norris, Cambridge; Robert J. Regan, Needham, both of Mass.

[73] Assignee: GTE Laboratories Incorporated, Waltham, Mass.

[21] Appl. No.: 135,808

[22] Filed: Dec. 18, 1987

[51] Int. Cl.$^4$ .......................... G02B 6/36; G02B 7/26
[52] U.S. Cl. .................... 350/96.20; 350/96.15
[58] Field of Search ............. 350/96.15, 96.17, 96.20; 250/553; 357/75

[56] References Cited

U.S. PATENT DOCUMENTS

| | | | |
|---|---|---|---|
| 4,030,811 | 6/1977 | Khoe et al. | 350/96.17 |
| 4,296,998 | 10/1981 | Dufft | 350/96.17 |
| 4,701,013 | 10/1987 | Jurczyszyn et al. | 350/96.20 |
| 4,721,353 | 1/1988 | Khoe et al. | 350/96.17 |
| 4,725,114 | 2/1988 | Murphy | 350/96.17 |
| 4,729,623 | 3/1988 | Mery | 350/96.20 |
| 4,730,198 | 3/1988 | Brown et al. | 350/96.20 |
| 4,732,446 | 3/1988 | Gipson et al. | 350/96.20 |
| 4,741,796 | 5/1988 | Althaus et al. | 350/96.17 |

Primary Examiner—William L. Sikes
Assistant Examiner—Robert E. Wise
Attorney, Agent, or Firm—David M. Keay

[57] ABSTRACT

Apparatus for supporting a group of optical fibers in proper alignment with associated laser devices and rear-facet photodetectors. The photodetectors and grooves for supporting the optical fibers are fabricated in a carrier member of device quality silicon. An array of a row of laser devices is moved laterally along a slot in the carrier member transverse to the grooves so as to align each laser device with a groove and with a photodetector. One or more carrier members may be mounted on a supporting structure adapted to receive them.

15 Claims, 2 Drawing Sheets

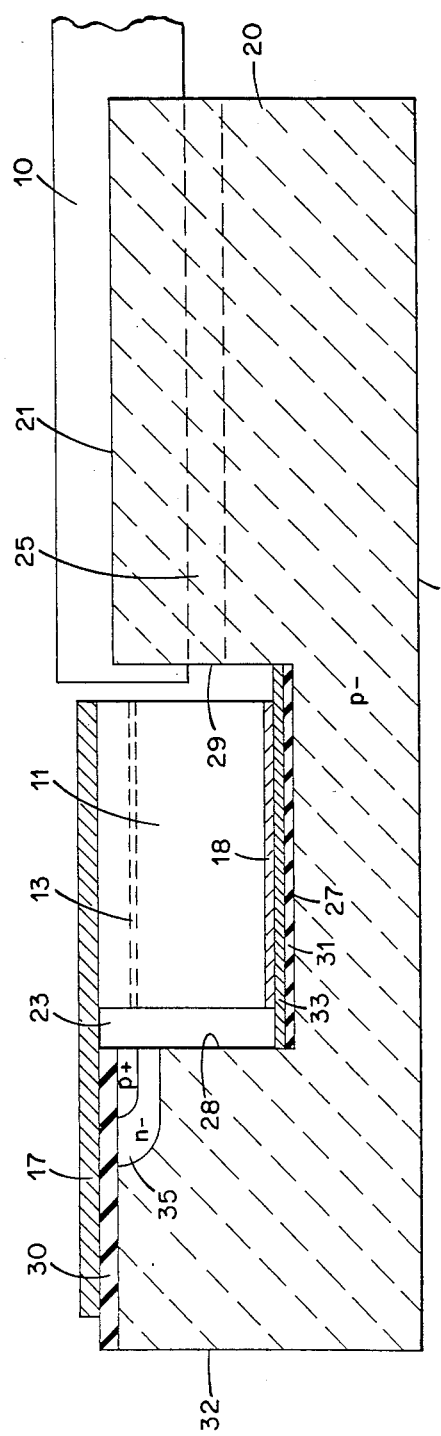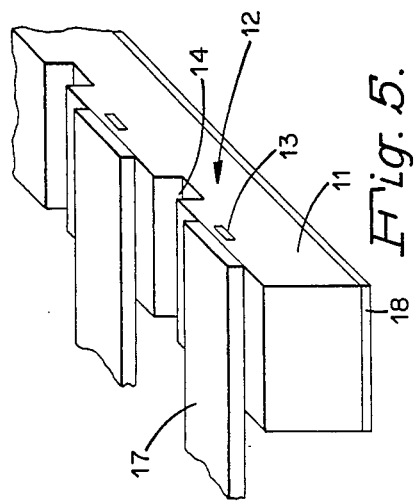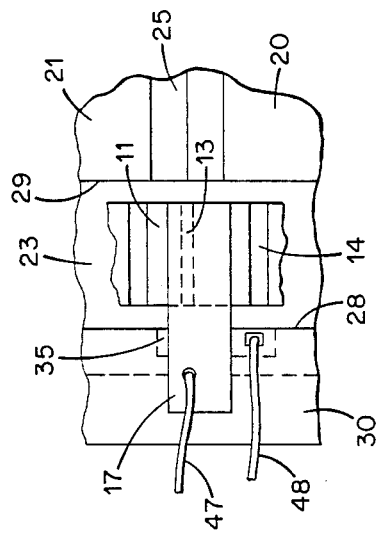

MOUNTING APPARATUS FOR OPTICAL FIBERS AND LASERS

BACKGROUND OF THE INVENTION

This invention relates to apparatus for mounting opticals fibers and laser devices. More particularly, it is concerned with apparatus for mounting a plurality of optical fibers in alignment with a plurality of laser devices.

In coupling laser devices to the end surfaces of optical fibers it is necessary to secure proper alignment between the light-emitting regions of the lasers and the light-receiving ends of the optical fibers. Problems arise in mounting a plurality of optical fibers and a plurality of laser devices while providing for ancillary circuitry, as for driving the laser devices, and electrical interconnections. Each of the optical fibers and laser devices must be properly aligned, and it is desirable that the space required for mounting the various components be minimized.

It is also desirable in certain arrangements of optical fibers and laser devices to provide light detecting devices, typically semiconductor diodes, called rear-facet detectors which monitor the light output of each laser device. The output of each rear-facet detector may be employed to adjust the driving circuitry for the associated laser device. Each optical fiber, the associated laser device, and the associated rear-facet detector must be properly aligned so as to provide optimum coupling. Driving circuitry must also be accommodated and electrical connections must be provided between certain of the components. In addition, in instances where a large number of optical fibers are mated with a large number of laser devices, the dissipation of heat generated in the laser devices becomes a significant factor requiring consideration.

SUMMARY OF THE INVENTION

Apparatus for mounting an array of laser devices in alignment with an array of optical fibers in accordance with the present invention comprises a carrier member of semiconductor material having a slot therein. An integral laser structure includes an array of semiconductor laser devices. The carrier member is adapted to receive the laser structure in the slot. The carrier member has a plurality of grooves therein. Each groove is adapted to receive an optical fiber and to position the optical fiber with an end thereof in light-receiving relationship adjacent to one of the laser devices. The carrier member has a plurality of light detecting devices therein adjacent to the slot. Each of the light detecting devices is aligned with a different one of the grooves and with one of the laser devices interposed between each light detecting device and the groove which is aligned therewith.

In another aspect of the invention, supporting structure includes apparatus for mounting an array of laser devices in alignment with an array of optical fibers as described. The supporting structure also comprises a supporting member adapted to receive and position the carrier member. The supporting member includes means for supporting and positioning an assemblage of circuitry elements closely adjacent to the slot of the carrier member.

DESCRIPTION OF THE DRAWINGS

In the drawings:

FIG. 3 is an elevational view in cross-section of a carrier member of the apparatus shown in greater detail than in FIG. 2;

FIG. 4 is an enlarged plan view showing a laser device mounted in the carrier member; and FIG. 5 is a fragmentary perspective view of an integral laser structure incorporating an array of semiconductor laser devices.

In the figures various elements are not necessarily to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above described drawings.

DETAILED DESCRIPTION

Figure 1:
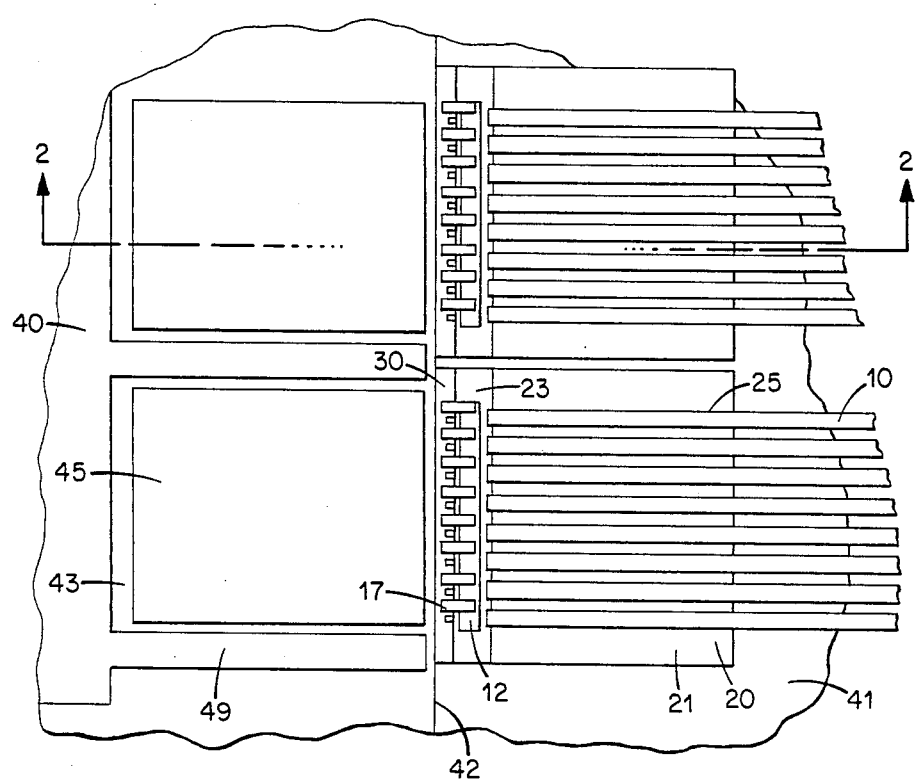
FIG. 1 is a plan view of a portion of apparatus in accordance with the present invention.
Figure 2:
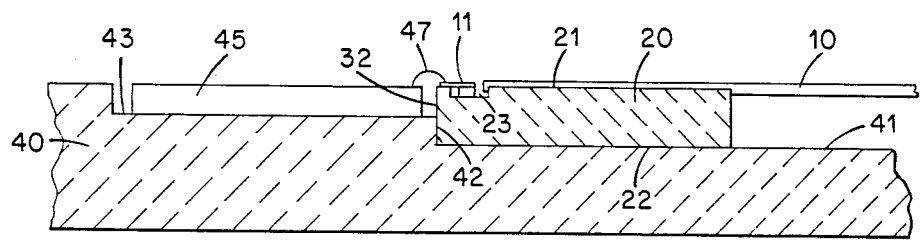
FIG. 2 is an elevational view taken in cross-section along line 2—2 of FIG. 1.

As illustrated in FIGS. 1, 2, and 3, apparatus in accordance with the present invention includes an arrangement for mounting a plurality of optical fibers 10, each in proper alignment with a laser device 11. The individual laser devices 11 are of conventional type, for example GaInAsP/InP heterojunction lasers with index guiding which operate with single transverse and longitudinal mode. As best seen in FIG. 5, the laser devices are arranged in an array and incorporated in an integrated unitary structure 12 of semiconductor material with the P-side up. The laser structure 12 is fabricated by employing conventional techniques to form heterojunction semiconductor devices having light-emitting junctions 13. The individual laser devices 11 are formed in arrays of straight rows with the laser devices of an array equally spaced along the row by employing well known photolithographic masking and etching processes. The laser devices of the array are electrically isolated from each other by trenches 14. Conventional techniques are employed to provide beam-lead contact members 17 in contact with the upper surface over each laser device 11. The beam-lead contact members 17 are cantilevered outward in a direction normal to the long dimension of the row of laser devices and lie generally in the same plane. A common metallized layer 18 is in ohmic contact with the bottom surface of the laser device structure 12.

The array of laser devices 11 and an equal number of optical fibers 10 (eight as shown in FIG. 1) are mounted in a carrier member 20 which is fabricated of a single piece of silicon of single crystal device quality. The carrier member 20 has a flat, planar, major upper surface 21 and a flat, planar, major bottom surface 22 parallel with the upper surface 21. A recess or slot 23 is formed in the upper surface 21 for receiving an integrated array of laser devices 12. The surface 21 also contains a plurality of V-shaped grooves 25 which are transverse to the slot 23 and terminate at the slot 23. Each groove 25 is adapted to support and position an optical fiber 10. The grooves 25 are equally spaced at the same spacing as the individual laser devices 11 of the array 12. The slot 23 may be formed by machining away the unwanted silicon. The grooves 25 are formed in the carrier member 20 by using known photolithographic masking and etching techniques. Therefore, their dimensions can be precisely controlled and the spacing of the grooves 25 can be made substantially the same as the spacing between the laser devices 11 in the array 12.

The slot 23, as best seen in FIG. 3, is of rectangular cross-section having a bottom surface 27 parallel to the major surfaces 21 and 22 of the carrier member 20 and side surfaces or walls 28 and 29 parallel to each other and orthogonal to the bottom surface 27. The slot 23 has a straight long dimension transverse to the direction of the grooves 25. The area of the upper major surface 21 between the side surface 28 of the slot 23 and the edge or side 32 of the carrier member 20 is coated with a deposit of silicon dioxide 30. The bottom surface 27 of the groove is coated with an insulating layer 31 of silicon dioxide having an overlying metallic contact layer 33. As required, other surfaces of the carrier member 20 may be oxidized to present an insulating surface.

Included along the side surface 28 of the slot 23 in the silicon carrier 20 are an array of rear-facet detectors 35, each of which is associated with one of the laser devices 11 of the array. The rear-facet detectors 35 are photodiodes having light sensitive junctions spaced appropriately along the side wall 28 of the slot 23 so as to receive light emitted from the associated laser devices 11. As illustrated these photodetectors are fabricated in the p— single crystal silicon of the carrier member 20 by employing well-known ion implantation or diffusion technologies. As illustrated, the array of photodiodes may have a common n— region with individual p+ regions inset therein. A common contact may be made to the n— region and individual contacts are made to the p+regions at openings in the silicon dioxide layer 30. Standard semiconductor fabrication techniques produce individual devices which are located along the side surface 28 of the slot 23 and precisely co-located with respect to the grooves 25 fabricated in the surface 21 on the opposite side of the slot 23.

The laser device structure 12 is placed in the slot 23 with the beam-leads 17 extending over the insulating silicon dioxide 30 and away from the grooves 25. The laser array structure 12 is of suitable dimensions with respect to the dimensions of the slot 23 so that the beam-leads 17 can contact the silicon dioxide layer 30 while the conductive layer 18 on the bottom surface of the laser array structure 12 rests on the metallic contact 32 over the bottom surface 27 of the laser mounting slot 23. As will be described in more detail hereinbelow the arrangement of the laser structure 12 and the slot 23 permits of movement of the laser structure along the long dimension of the slot to obtain proper alignment of the light emitting region 13 of each laser device 11 with the associated groove 25 for supporting an optical fiber and with the associated rear-facet detector 35. When proper alignment has been obtained, the beam-leads are located on top of the silicon dioxide 30 and the metal contact 18 at the bottom surface of the array of lasers is attached to the metallic contact 32 at the bottom of the slot by using a eutectic solder.

Thus, the assembly of the carrier member 20 and the array of laser devices 12 including the rear-facet detectors 35 and the grooves 21 provides apparatus for mounting an array of laser devices in alignment with an array of optical fibers. The techniques employed in fabricating the various components permit precise control of individual dimensions. Thus, it is possible to obtain precise alignment of each optical fiber 10, the associated laser device 11, and the associated rear-facet detector 35.

As illustrated in FIGS. 1 and 2, the carrier member 20 which is a single piece of silicon fabricated as an integral unit is mounted on a supporting structure 40. The supporting structure 40 may be of silicon or other suitable insulating material. The supporting structure 40 has a flat, planar, major horizontal surface 41 which terminates at an upstanding vertical wall or surface 42. The carrier member 20 is mounted on the supporting structure 40 with its bottom surface 22 on the horizontal surface 41 of the supporting structure and its edge surface 32 abutting the vertical wall 42 of the supporting structure 40.

Another flat, planar, horizontal surface 43 of the supporting structure 40 lies parallel to the surface 41. It is spaced above the surface 41 and terminates at the vertical surface 42 to form a step. An assemblage of circuitry 45 as in the form of an integrated circuit is mounted on the surface 43. The circuitry includes driver circuits for each of the laser devices 11 of an array and may also provide other functions. The surface 43 of the supporting structure 40 is at a vertical height such that contacts for the assemblage of circuitry 45 are at approximately the same level as the beam-leads 17 of the laser devices 11. The circuit assemblage 45 is mounted closely adjacent to the step provided by the vertical wall 42 and thus closely adjacent to the carrier member 20 permitting short wire bond connections 47 to be made between the beam-leads 17 of the laser devices 11 and their driver circuits. Bond wires 48 between the rear-facet detectors 35 and the circuitry 45 are also very short. The beam-leads 17 provide relatively large contact areas for the wire bonds 47. An electrical connection (not shown) is readily provided between the circuitry 45 and the common contact 32 to the laser structure 12. The carrier member 20 and the overlying electrically insulating coating 30 provides a firm supporting surface for the beam-leads 17, and provides for effective heat dissipation from the laser devices 11.

As illustrated in FIG. 1 more than one carrier member 20 may be mounted on a single supporting structure 40. Each of the carrier members 20 includes an array 12 of aligned beam-leaded laser devices 11, rear-facet detectors 35, and V-shaped grooves 25 for supporting in proper alignment the optical fibers 10. Each carrier member is placed on the supporting structure 40 with its edge surface 32 abutting the vertical wall 42 of the supporting structure so as to position the carrier member on the supporting structure. An integrated circuit 45 or other assemblage of necessary ancillary circuitry is affixed to the mounting surface 43 of the supporting structure 40 closely adjacent to the array of beam-leads 17 of the laser devices 11 of an array 12. The mounting surface 43 for each integrated circuit 45 may be recessed from the uppermost surface of the supporting structure 40 and separated from other such mounting surfaces 43 by intervening ridges 49.

As discussed hereinabove the V-shaped grooves 25 for supporting optical fibers and the rear-facet photodetectors 35 are fabricated in the silicon carrier member 20 by employing well-known techniques of photolithographic masking and etching, and ion implantation or diffusion to provide precise alignment between these elements. Each array or row 12 of laser devices is fabricated by employing similar techniques which provide precise dimensioning of these components. Thus, accurate alignment can be obtained between the groove 25, rear-facet detector 35, and laser device 11 of each set simultaneously by laterally moving the array of laser devices along the long dimension of the slot 23 into the proper position.

The fabrication of the carrier member 20 with precise alignment of each V-shaped groove 25 with an associated rear-facet detector 35 permits an array 12 of laser devices 11 to be accurately positioned in the slot between the V-shaped grooves 25 and the rear-facet detectors 35. Optical fibers 10 are placed in one or more of the V-shaped grooves 25 and light is transmitted in the reverse direction through the optical fibers from lasers at the opposite ends toward the ends adjacent to the slot 23. This light is detected by the associated rear-facet detectors 35 and suitable circuitry connected therewith. An array 12 of laser devices is placed in the slot 23 and manipulated therealong by conventional micromanipulator apparatus while the outputs of the appropriate rear-facet detectors 35 are monitored. Light emitted from the light-transmitting optical fibers is modified by the transmission characteristics of the interposed laser device 11 with the active region 13 of the laser device acting as a passive waveguide. A change in the detected signal occurs as the active region 13 crosses the fiber axis. The array of laser devices is manipulated to maximize these signals indicating proper alignment between the V-shaped grooves and laser devices of the array. The laser array is fixed to the carrier members as by fusing the metal contact 18 at the bottom of the array of laser devices with the metallized surface 32 at the bottom 27 of the slot 23 while maintaining their optimum physical relationship. By virtue of the precision of spacing of the laser devices 11 in the structure 12 and of the grooves 25 in the carrier member 20, all the laser devices 11 of the array 12 are properly aligned with their corresponding grooves 25. This technique of obtaining alignment by monitoring the transmission of light through one or more laser devices is very precise.

Thus, the arrangement of a silicon carrier member as described in combination with the linear array of laser devices having beam-lead contact members provides a mounting arrangement for precisely aligning optical fibers with the laser devices and also with built-in rear-facet detectors. The significance of such precision in handling component associated with optical fibers and laser devices is apparent when considering that the core of an optical fiber typically is of the order of 50 micrometers or less in diameter and the light emitting area of a laser device of the type described may be approximately 5 micrometers in width. In addition to precise alignment, good heat dissipating characteristics are obtained for the laser devices because of the beam-lead contact members and their mounting arrangement on the carrier member. Since wire bonding to the laser devices is done on the beam-leads externally of the semiconductor structure, bonding parameters can be maximized for maximum reliability without compromising the mechanical integrity of the laser devices. The ancillary circuitry for driving the laser devices, monitoring their operation, and performing other functions may be placed closely adjacent to the elements mounted on the carrier member by the arrangement of the carrier member and supporting structure as described.

While there has been shown and described what is considered a preferred embodiment of the present invention, it will be obvious to those skilled in the art the various changes and modifications may be made therein without departing from the invention as defined by the appended claims.

What is claimed is:

1. Apparatus for mounting an array of laser devices in alignment with an array of optical fibers comprising:
    a carrier member of semiconductor material;
    a slot in said carrier member;
    an integral laser structure comprising an array of semiconductor laser devices;
    said carrier member being adapted to receive said laser structure in said slot;
    a plurality of grooves in said carrier member, each groove being adapted to receive an optical fiber and to position the optical fiber with an end thereof in light-receiving relationship adjacent to one of said laser devices; and
    a plurality of light detecting devices in said carrier member adjacent to said slot, each of said light detecting devices being aligned with a different one of said grooves with one of said laser devices being interposed between a light detecting device and the groove which is aligned therewith.

2. Apparatus in accordance with claim 1 wherein
    said slot is adapted to permit movement of said laser structure with respect to said grooves and light detecting devices to obtain alignment of each laser device with one of said grooves and light detecting devices prior to fixing the laser structure in position in said carrier member.

3. Apparatus in accordance with claim 2 wherein
    said slot is a straight, elongated slot;
    said grooves are straight, elongated grooves disposed parallel to each other and transverse to said slot;
    the laser devices of said array are arranged in a row; and
    said slot is adapted to receive said laser structure and to permit lateral movement of the laser structure along the length of the slot to obtain alignment of each laser device with one of said grooves and light detecting devices.

4. Apparatus in accordance with claim 3 wherein
    said carrier member is a single integral structure of single crystal silicon; and
    each of said light detecting devices is fabricated in a portion of said single crystal silicon integral with the carrier member.

5. Apparatus in accordance with claim 4 wherein
    said slot is of generally rectangular configuration generally transverse to its elongated dimension and has opposite side surfaces extending along the elongated dimension of the slot;
    each of said grooves terminates at one of said side surfaces; and
    each of said light detecting devices is located in the other side surface directly opposite one of said grooves.

6. Apparatus in accordance with claim 5 wherein
    said slot has a bottom surface between said side surfaces;
    said laser structure has a bottom surface adapted to be fixed to the bottom surface of the slot subsequent to the laser devices being aligned with respect to the grooves and the light detecting devices; and
    each of said laser devices is adapted to emit light so as to impinge on the end surface of the optical fiber located in the groove aligned therewith and to emit light so as to impinge on the light detecting device aligned with the groove.

7. Apparatus in accordance with claim 6 wherein
each laser device of said laser structure has a beam-lead contact member extending therefrom in a common plane; and
said carrier member is adapted to receive said laser structure in said slot with said beam-lead members in physical contact with an insulating surface of the carrier member.

8. Supporting structure including apparatus for mounting an array of laser devices in alignment with an array of optical fibers, said supporting structure comprising
a carrier member of semiconductor material;
a slot in said carrier member;
an integral laser structure comprising an array of semiconductor laser devices;
said carrier member being adapted to receive said laser structure in said slot;
a plurality of grooves in said carrier member, each groove being adapted to receive an optical fiber and to position the optical fiber with an end thereof in light-receiving relationship adjacent to one of said laser devices;
a plurality of light detecting devices in said carrier member adjacent to said slot, each of said light detecting devices being aligned with a different one of said grooves with one of said laser devices being interposed between a light detecting device and the groove which is aligned therewith; and
a supporting member adapted to receive and position said carrier member;
said supporting member having means for supporting and positioning an assemblage of circuitry elements closely adjacent to said slot of the carrier member.

9. Apparatus in accordance wit claim 8 wherein
said slot is adapted to permit movement of said laser structure with respect to said grooves and light detecting devices to obtain alignment of each laser device with one of said grooves and light detecting devices prior to fixing the laser structure in position in said carrier member.

10. Apparatus in accordance with claim 9 wherein
said slot is a straight, elongated slot;
said grooves are straight, elongated grooves disposed parallel to each other and transverse to said slot;
the laser devices of said array are arranged in a row; and
said slot is adapted to receive said laser structure and to permit lateral movement of the laser structure along the length of the slot to obtain alignment of each laser device with one of said grooves and light detecting devices.

11. Apparatus in accordance with claim 10 wherein
each laser device of said laser structure has a beam-lead contact member extending therefrom in a common plane; and
said carrier member is adapted to receive said laser structure in said slot with said beam-lead members in physical contact with an insulating surface of the carrier member.

12. Component supporting apparatus in accordance with claim 11 wherein
said carrier member has a substantially flat planar upper surface, a substantially flat planar lower surface parallel to said upper surface, and a flat planar side surface normal to said upper and lower surfaces;
said slot is formed in said upper surface closely adjacent and parallel to said side surface;
said insulating surface area of the carrier member lies in said upper surface and is disposed between said slot and said side surface of the carrier member;
said grooves are formed in said upper surface of the carrier member;
said supporting member has a first, flat, planar upper surface terminating at a vertical wall;
said supporting member is adapted to receive said carrier member with said lower surface of the carrier member in contact with said first upper surface of the supporting member and with said side surface of the carrier member abutting said vertical wall of the supporting member;
said supporting member has a second flat, planar upper surface parallel to said first surface and terminating adjacent to said vertical wall; and
said supporting member is adapted to receive an assemblage of circuit elements having a flat planar bottom surface in contact with said second upper surface.

13. Apparatus in accordance with claim 12 wherein
said carrier member is a single, integrated structure of single crystal silicon; and
each of said light detecting devices is fabricated in a portion of said single crystal silicon integral with the carrier member.

14. Apparatus in accordance with claim 13 wherein
said slot is of generally rectangular configuration generally transverse to its elongated dimension and has opposite side surfaces extending along the elongated dimension of the slot;
each of said grooves terminates at one of said side surfaces; and
each of said light detecting devices is located in the other side surface directly opposite one of said grooves.

15. Apparatus in accordance with claim 14 wherein
said slot has a bottom surface between said side surfaces;
said laser structure has a bottom surface adapted to be fixed to the bottom surface of the slot subsequent to the laser devices being aligned with respect to the grooves and the light detecting devices; and
each of said laser devices is adapted to emit light so as to impinge on the end surface of the optical fiber located in the groove aligned therewith and to emit light so as to impinge on the light detecting device aligned with the groove.

* * * * *